United States Patent [19]
Shimogawa

[11] Patent Number: 5,557,232
[45] Date of Patent: Sep. 17, 1996

[54] SEMICONDUCTOR INTEGRATED CIRCUIT DEVICE HAVING A CONTROL CIRCUIT FOR SETTING THE TEST MODE

[75] Inventor: Kenjyu Shimogawa, Tokyo, Japan

[73] Assignee: NEC Corporation, Tokyo, Japan

[21] Appl. No.: 288,778

[22] Filed: Aug. 11, 1994

[30] Foreign Application Priority Data

Aug. 13, 1993 [JP] Japan .................................. 5-201340

[51] Int. Cl.$^6$ ....................................... G05F 1/10
[52] U.S. Cl. .................... 327/545; 365/201; 365/226; 327/546
[58] Field of Search ....................... 365/189.03, 189.09, 365/226, 201; 327/544, 545, 546, 403, 404, 405, 407, 408, 409, 410, 411

[56] References Cited

U.S. PATENT DOCUMENTS

| | | | |
|---|---|---|---|
| 4,958,324 | 9/1990 | Devin | 365/189.03 |
| 5,283,762 | 2/1994 | Fujishima | 365/189.09 |
| 5,327,388 | 7/1994 | Kobayashi | 365/189.09 |
| 5,337,272 | 8/1994 | Suwa et al. | 365/189.03 |
| 5,347,170 | 9/1994 | Hayakawa et al. | 327/546 |
| 5,396,113 | 3/1995 | Park et al. | 365/189.09 |

FOREIGN PATENT DOCUMENTS 64-81019  3/1989  Japan .
3-149876  6/1991  Japan .
3-160699  7/1991  Japan .

*Primary Examiner*—Toan Tran
*Attorney, Agent, or Firm*—Popham, Haik, Schnobrich & Kaufman, Ltd.

[57] ABSTRACT

In a semiconductor integrated circuit device including a step-down circuit for stepping down an external power supply voltage to obtain an internal power supply voltage, the external power supply voltage can be applied to an internal signal processing circuit using a conventional terminal. The semiconductor integrated circuit device has a receiver circuit (1) constituted such that the level of an output signal (S1) of the receiver circuit is set in a binary state in accordance with the level of an inverted write enable signal WE0 of an SRAM, a switch circuit (3) for switching the level of an output signal (VE) to a value equal to a predetermined internal power supply voltage value or an external power supply voltage value (VEE) in response to the level of the output signal (S1) of the receiver circuit, and a driver circuit (4) for generating, from the external power supply voltage (VEE), a voltage value equal to the level of the output signal (VE) from the switch circuit (3) and applying the voltage to the internal signal processing circuit. A reference voltage ($V_{ref}$) having a level lower than the "L" level of the signal WE0 during the normal operation of the SRAM is applied to another input terminal of the receiver circuit (1).

3 Claims, 4 Drawing Sheets

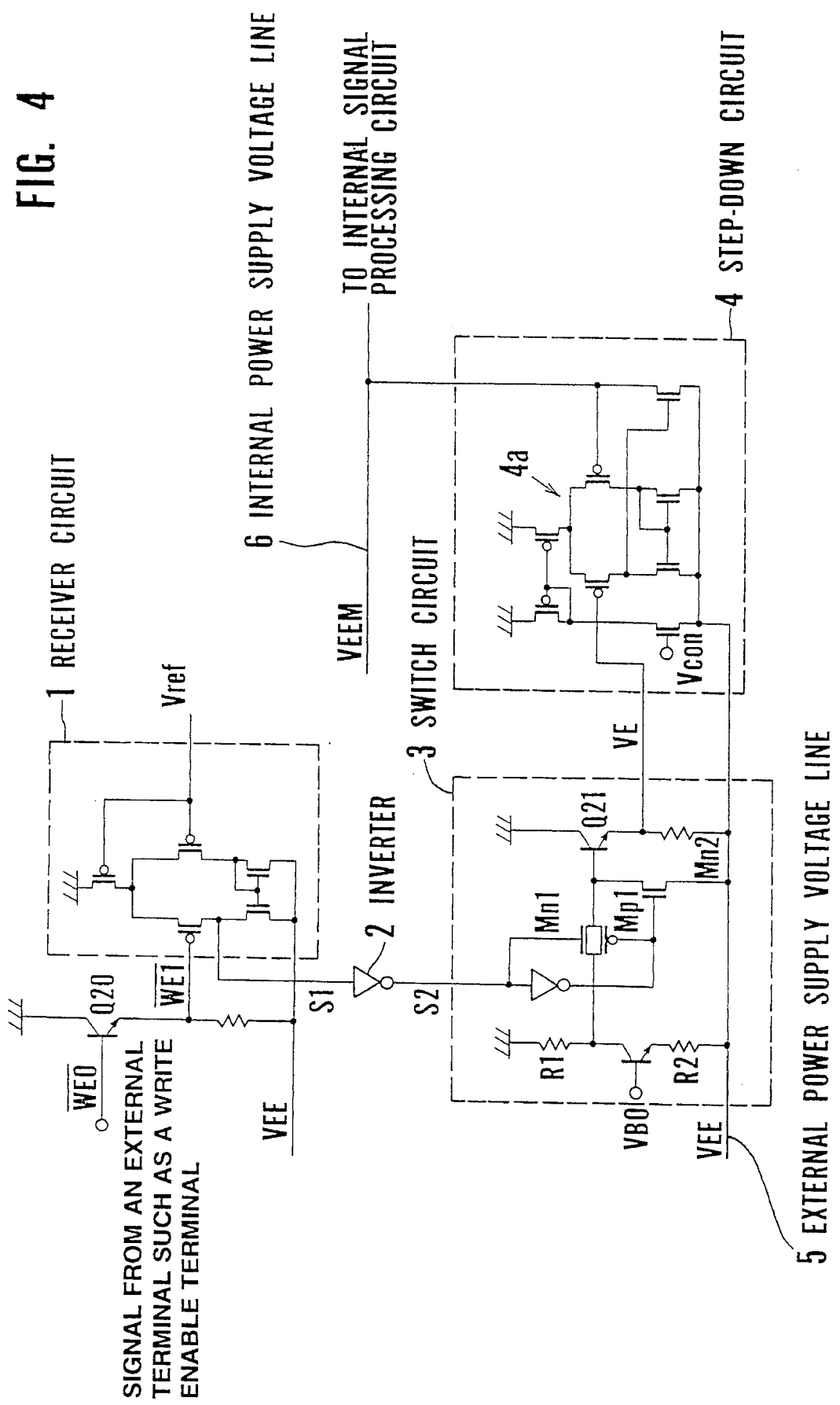

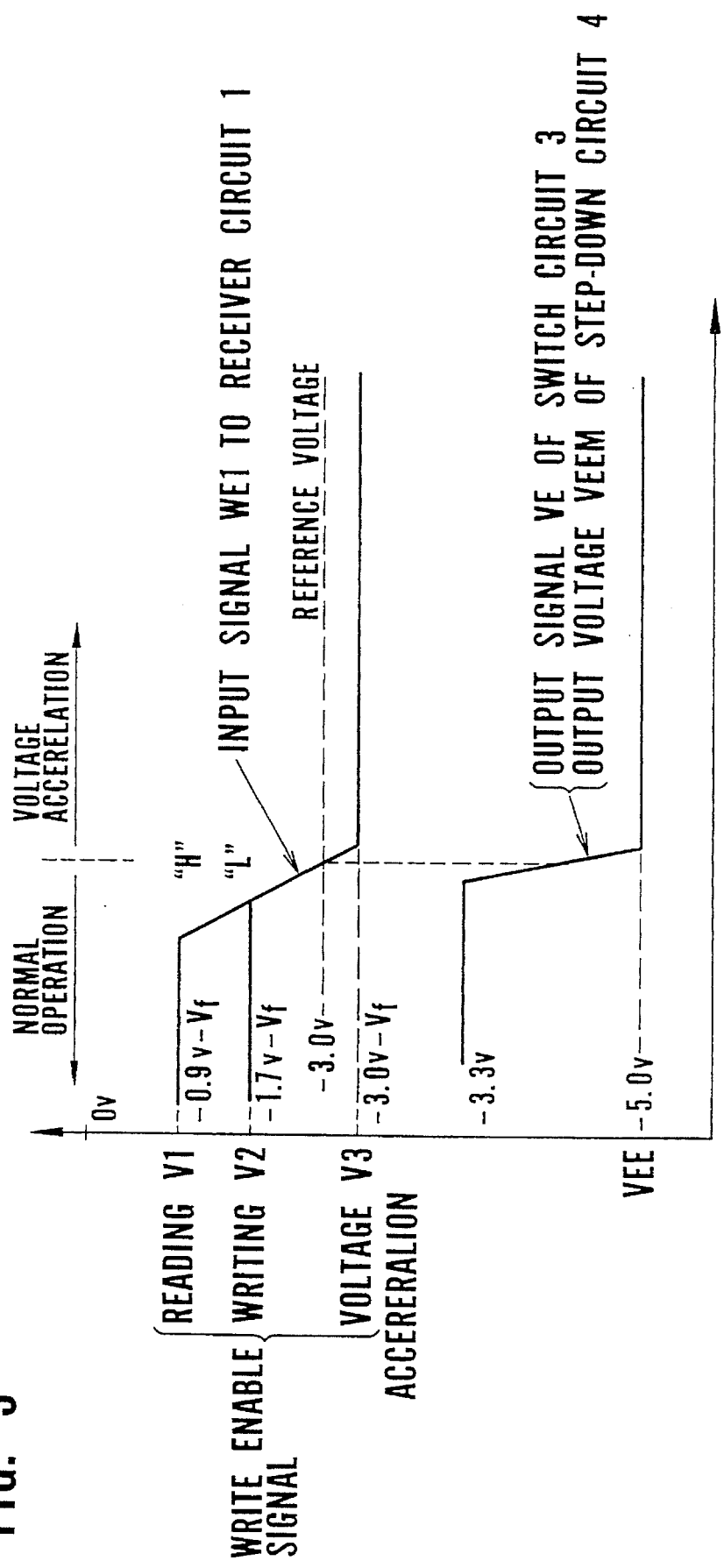

SEMICONDUCTOR INTEGRATED CIRCUIT DEVICE HAVING A CONTROL CIRCUIT FOR SETTING THE TEST MODE

BACKGROUND OF THE INVENTION

1. Field of the Invention

The present invention relates to a semiconductor integrated circuit device and, more particularly, to a semiconductor integrated circuit device including a step-down circuit for stepping down a power supply voltage externally applied and applying the voltage to an internal signal processing circuit as an internal power supply voltage.

2. Description of the Prior Art

With the progress of the manufacturing process of a semiconductor integrated circuit or finer circuit elements, from the viewpoint of reliability, a technique is generally used in which a step-down circuit is internally provided to step down an external power supply voltage of, e.g., 5 V to a voltage of 3 to 4 V, and the voltage is applied to an internal signal processing circuit. However, voltage acceleration cannot be performed with such a stepped-down power supply voltage for a burn-in test or an aging test. For this reason a life test cannot be efficiently performed.

As an example of a means of solving this problem, Japanese Unexamined Patent Publications Nos. 64-81019, 3-149876, and 3-160699 disclose a technique in which an exclusive external terminal is provided, and a control signal is externally supplied to this terminal, thereby controlling the presence/absence of a voltage drop operation or the value of a voltage drop.

FIG. 1 is a circuit diagram of a semiconductor integrated circuit found in Japanese Unexamined Patent Publication No. 64-81019. Referring to FIG. 1, in this semiconductor integrated circuit, when a high operating power supply voltage is required for burn-in test or voltage acceleration test, a ground potential is applied to an external control terminal PC which is exclusively used for control. Transistors Q2 and Q3 in the step-down circuit control circuit are turned off, and a transistor Q1 is turned on. With this operation, the voltage at an internal power supply terminal Vddi is almost equalized with the voltage at an external power supply terminal Vddo. A voltage higher than the power supply voltage (3 to 4 V) in a normal operative state is obtained to perform voltage acceleration.

Also in the semiconductor integrated circuit device in Japanese Unexamined Patent Publication No. 3-149876, as shown in FIG. 2, a control signal C is input to an internal step-down power supply circuit from an external terminal which is exclusively used for control, thereby controlling the presence/absence of the voltage drop operation. Referring to FIG. 2, a reference voltage VR applied to the gate electrode of a transistor Q4 defines an output level VCL from an internal step-down power supply circuit. When voltage acceleration is to be performed, a ground potential is applied to the control signal C to turn off a transistor Q6, thereby setting the output VCL in a high impedance state in accordance with the OFF state of the transistors Q4, Q1, and Q3. At this time, when a power supply voltage VCCE is applied from another external power supply voltage line, voltage acceleration can be performed.

In the semiconductor integrated circuit device disclosed in Japanese Unexamined Patent Publication No. 3-160699, a test mode is set in accordance with an internally generated control signal without using any external terminal exclusively used for control. As shown in FIG. 3, the step-down circuit of this integrated circuit device is constituted by a reference voltage generation circuit VrG, a switch circuit SC, and a step-down circuit VD. Referring to FIG. 3, during the normal operation, a control signal Te is set to "L" level. A transistor Q14 is turned on to transmit a reference voltage Vr1 generated by the reference voltage generation circuit VrG to the step-down circuit VD, thereby equalizing an internal power supply voltage Vcd with the reference voltage Vr1. In the test mode, the control signal Te is set to "H" level. A transistor Q15 is turned on to transmit a reference potential Vr2 (=external power supply voltage VCC) to the step-down circuit VD. The output voltage Vcd from the step-down circuit VD is almost equalized with the external power supply voltage VCC, so voltage acceleration can be performed.

If the step-down circuit having the above arrangement is applied to, e.g., a dynamic RAM, the control signal Te in FIG. 3 is generated in a timing generation circuit (not shown) for generating various timing signals in combination with a row address strobe signal, a column address strobe signal, and a write enable signal, all of which are externally supplied to the RAM as starting control signals. Therefore, an external control terminal for setting a test mode, i.e, controlling the presence/absence of the voltage drop operation is not particularly needed. When the reference potential Vr2 for setting the output voltage from the step-down circuit VD to the power supply voltage Vcc upon voltage acceleration is externally applied through an address input terminal A0, the output voltage from the step-down circuit in the test mode can be arbitrarily set.

In the semiconductor integrated circuit incorporating a step-down circuit as disclosed in Japanese Unexamined Patent Publications Nos. 64-81019 or 3-149876, when a conventional method is used in which the operative/inoperative state of the internal step-down circuit is controlled using an external terminal exclusively used for control, an external terminal and a pad, which are exclusively used for this purpose, are needed. As a result, an exclusive pin is needed to mount this integrated circuit on a package, and the size of the package is increased. In addition, the space for mounting the integrated circuit on a board is accordingly increased.

According to the invention disclosed in Japanese Unexamined Patent Publication No. 3-160699, setting of the test mode or the test voltage value can be controlled without adding an external terminal. In this case, however, to set the test mode, the starting control signals for the integrated circuit must be combined and fixed for the test mode. In addition, the input level to at least one external terminal must be fixed to a test voltage. Therefore, voltage acceleration in the operative state (e.g., dynamic operation of a dynamic RAM) of the integrated circuit cannot be performed.

SUMMARY OF THE INVENTION

It is an object of the present invention to provide a semiconductor integrated circuit device having a step-down circuit for stepping down an external power supply voltage and applying the voltage to an internal signal processing circuit, which can perform a voltage acceleration test in a normal operative state without using an external terminal exclusively used for control of the voltage acceleration test.

According to the present invention, there is provided a semiconductor integrated circuit device having a step-down circuit for stepping down a power supply voltage which is externally applied to a predetermined voltage and applying the obtained stepped-down voltage to an internal signal processing circuit as an internal power supply voltage, wherein the output voltage value from the step-down circuit can be switched to the predetermined voltage value or a value different from the predetermined voltage value in accordance with the level of a signal which is externally supplied to an external terminal used for the normal signal processing operation of the semiconductor integrated circuit device.

BRIEF DESCRIPTION OF THE DRAWINGS

FIG. 4 is a circuit diagram of a step-down circuit in a semiconductor integrated circuit device according to an embodiment of the present invention; and FIG. 5 illustrates the potentials of various portions of the circuit shown in FIG. 4 in both operation mode and voltage acceleration mode.

DETAILED DESCRIPTION OF THE PREFERRED EMBODIMENT

Figure 1:
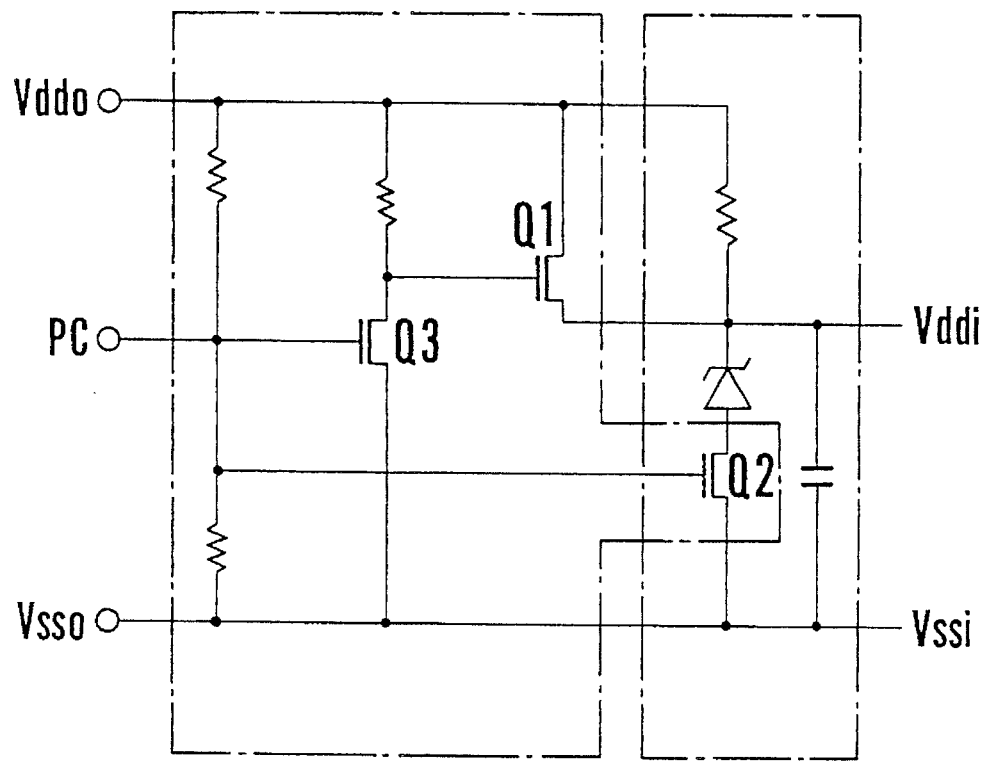
FIG. 1 is a circuit diagram of an example of a step-down circuit in a conventional semiconductor integrated circuit.
Figure 2:
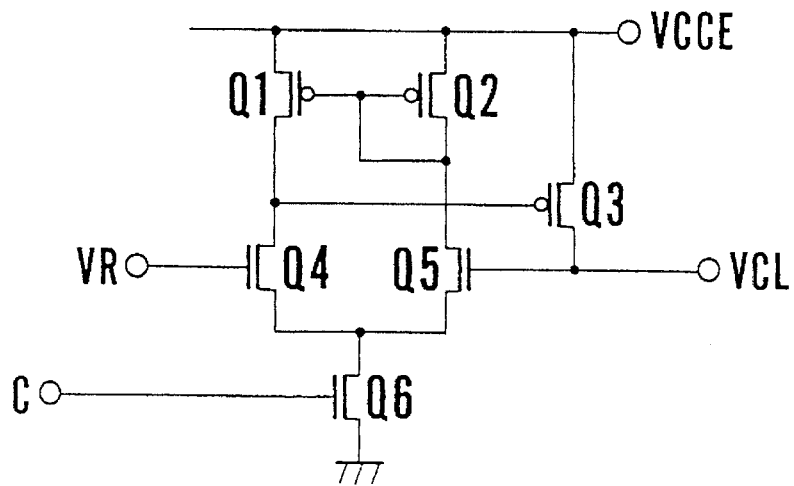
FIG. 2 is a circuit diagram of another example of a step-down circuit in conventional semiconductor integrated circuit.
Figure 3:
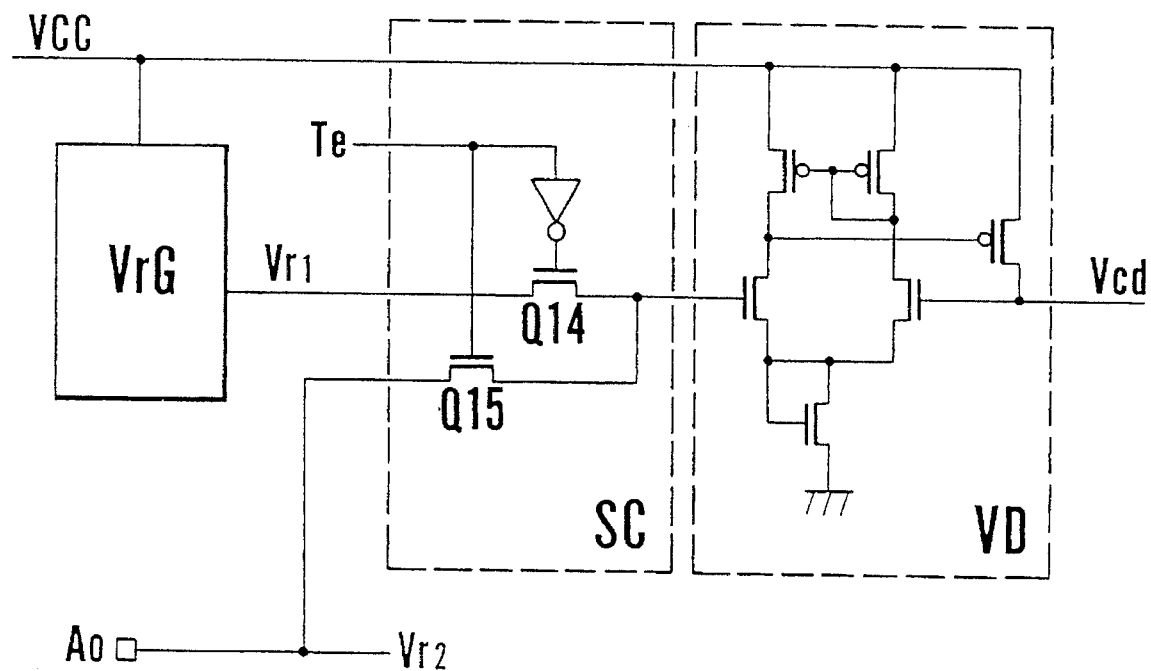
FIG. 3 is a circuit diagram of still another example of a step-down circuit in a conventional semiconductor integrated circuit.

The present invention will now be described below with reference to the accompanying drawings.

FIG. 4 is a circuit diagram showing a step-down circuit according to an embodiment in which the present invention is applied to a static RAM (SRAM).

Referring to FIG. 4, in this step-down circuit, an inverted write enable signal $\overline{WE0}$ which is input to a write enable terminal (not shown) as one of the external terminals of this SRAM is input to the base electrode of an npn bipolar transistor Q20.

An inverted signal $\overline{WE1}$ whose level is lower than that of the inverted input signal $\overline{WE0}$ by a base-emitter voltage Vf of the transistor Q20 is output from the emitter electrode of the transistor Q20 and input to a differential amplifier type receiver circuit 1. A reference voltage $V_{ref}$ is input to another input terminal of the receiver circuit 1. The value of the reference voltage $V_{ref}$ is set to $-3.0$ V, as is apparent from the following description of an operation of the circuit.

An output signal S1 from the receiver circuit 1 is input to a switch circuit 3 through an inverter 2. The level of an output signal VE from the switch circuit 3 is set in a binary state in accordance with the level of the output signal S1 from the receiver circuit 1.

The output signal VE from the switch circuit 3 is input to a following step-down circuit 4 to define the output voltage level of the step-down circuit 4, i.e., the power supply voltage level of the internal signal processing circuit of this SRAM. The step-down circuit 4 is constituted by an operational amplifier including a current mirror circuit 4a.

The operation of the above-described step-down circuit will be described below.

When the step-down circuit performs a normal Emitter Coupled Logic (ECL) operation, the "H" and "L" levels of the write enable signal $\overline{WE0}$ are V1=$-0.9$ V and V2=$-1.7$ V, respectively. In the normal operative state of the SRAM, a "read state" is set when the signal $\overline{WE0}$ is set to "H" level (V1=$-0.9$ V), and a "write state" is set when the signal $\overline{WE0}$ is set to "L" level (V2=$-1.7$ V). At this time, the receiver circuit 1 serves as a differential amplifier. The output signal S1 from the receiver circuit 1 is held at "L" level regardless of the write enable signal $\overline{WE0}$ set at "H" or "L" level. The signal S1 is inverted by the inverter 2 and input to the switch circuit 3 as a signal S2 set at "H"level. An n-MOS transistor Mn1 and a p-MOS transistor Mp1 are turned on by this signal S2 at "H" level while an n-MOS transistor Mn2 is turned off. Therefore, the output VE from the switch circuit 3 has a level lower than that defined by a constant voltage VBO and resistors R1 and R2 by the base-emitter voltage $V_f$ of an npn bipolar transistor Q21. This level is set to an internal voltage drop level of $-3.3$ under in the normal operation of the SRAM. This value is higher than a voltage VEE of $-5$ V of an external power supply voltage line 5 by 1.7 V. The step-down circuit 4 receives the output signal VE from the switch circuit 3 to apply an internal power supply voltage VEEM stepped down to a level of $-3.3$ V which is the same as that of the signal VE to an internal power supply voltage line 6 by the current mirror circuit 4a. The current in the step-down circuit 4 is controled by control signal When the internal voltage drop is to be controlled to perform the voltage acceleration test of the SRAM, the input level of the write enable signal $\overline{WE0}$ is set to a level of $-3.0$ V lower than "L" level ($-1.7$ V) under the normal operation. At this time, a voltage level V3 of the input signal $\overline{WE1}$ to the receiver circuit 1 is lower than the voltage of $-3.0$ V by the base-emitter voltage $V_f$ of the transistor Q20 and represented by $-3.0-V_{ref}$. For this reason, the output signal S1 from the receiver circuit 1 is set to "H" level, and the input signal S2 to the switch circuit 3 is set to "L" level through the inverter 2. Therefore, the n-MOS and p-MOS transistors Mn1 and Mp1 in the switch circuit 3 are turned off while the transistor Mn2 is turned on. As a result, the level of the output signal VE from the switch circuit 3 is dropped to a level near the external power supply potential VEE (=$-5$ V). The step-down circuit 4 receives this level to apply the internal power supply voltage VEEM having a level of almost the same as the external power supply voltage level VEE by the current mirror circuit 4a, thereby applying a high electric field necessary for voltage acceleration to the internal signal processing circuit (not shown).

FIG. 5 shows the relationship among the levels of the input signal $\overline{WE1}$ to the receiver circuit 1, the reference voltage $V_{ref}$, the output signal VE from the switch circuit 3, and the output voltage VEEM from the step-down circuit 4. Referring to FIG. 5, the voltages V1 and V2 have levels lower than "H" level (in this case, $-0.9$ V) and "L" level ($-1.7$ V) during the normal ECL input operation by the base-emitter voltage $V_f$ of the transistor Q20, respectively. The voltage V3 is set to a level lower than a voltage of $-3.0$ V by the base-emitter voltage $V_f$ to have a margin of about 400 to 800 mV with respect to the reference voltage $V_{ref}$($-3.0$ V). When the level of the input signal $\overline{WE1}$ to the receiver circuit 1 is lower than the reference voltage Vref to reach the level of the voltage V3, the SRAM is set to the internal voltage drop control mode, and the signal VE and the internal power supply voltage VEEM are equalized with the external power supply voltage VEE.

An example in which the write enable signal $\overline{WE0}$ of the SRAM is used as a control signal has been described above. In this case, when the internal voltage drop is to be controlled to perform voltage acceleration, the write enable signal $\overline{WE0}$ is set to "L" level, so the SRAM is always set in the write state. That is, voltage acceleration for a burn-in test or the like is always performed in the write state. In this embodiment, when a burn-in test must be performed in both the write and read states, voltage acceleration can be performed in both states by using a data input terminal in place of the write enable terminal as an external terminal used to input a control signal.

To operate the step-down circuit shown in FIG. 4, the power supply voltage VEE and the constant voltages, $V_{CON}$, $V_{ref}$ and VBO are needed. The constant voltages, $V_{CON}$, $V_{ref}$ and VBO are generated from the power supply voltage applied to the SRAM, and the power supply voltage is directly used as the voltage VEE. As a terminal for inputting a signal to the base electrode of the transistor Q20 as a control signal, an external terminal such as a write enable terminal or a data input terminal used for the normal signal processing operation of the SRAM can be used, as described above. Therefore, in this embodiment, no additional external terminal is needed to operate the step-down circuit.

Generally, when the number of control terminals increases by one in a package, e.g., having lead terminals extending from both sides, the number of pins increases by two. Assuming that a 28-pin SOJ (Small Outline J-Lead) package is replaced with a 30-pin SOJ package, the package size is increased by 1.3 mm along the longitudinal direction, and the area is increased by 7%. In this embodiment, an increase in area is avoided, thereby permitting higher density mounting.

As has been described above, in the semiconductor integrated circuit device of the present invention, a signal having an input level out of the range of a normal signal input level is supplied to a conventional external terminal used for a normal signal processing operation. With this operation, the internal voltage drop can be directly controlled to apply the external power supply voltage to the internal signal processing circuit. According to the present invention, voltage acceleration for aging or burn-in tests can be performed using the conventional external terminal. Therefore, any additional external terminal which is exclusively used for control need not be provided, so the number of pins of a package is not changed. In addition, voltage acceleration can be performed under the normal operative state.

What is claimed is:

1. A semiconductor integrated circuit device comprising:
   an external write enable terminal used for normal signal processing;
   a receiver circuit having an input and an output, said receiver circuit being responsive to a signal on said input for producing a switching signal on said output of said receiver circuit;
   means for applying an input signal from said external write enable terminal to said input of said receiver circuit;
   a switching circuit having an input and an output, said switching circuit being responsive to said switching signal on said input of said switching circuit for being set in a binary state and producing a voltage output signal at said output of said switching circuit, said voltage output signal being set at a first or a second level based on said switching signal;
   second circuit means for receiving said voltage output signal and producing a power supply voltage signal, said power supply voltage signal being of a first value or a second value, said second value of said power supply voltage signal being approximately equal to said second level of said voltage output signal; and
   third circuit means for applying said power supply voltage signal of said second circuit means to a signal processing circuit.

2. The semiconductor integrated circuit of claim 1, wherein said receiver circuit further comprises means for changing said switching signal based on a threshold signal that is out of the range of the signal level applied to the external write enable terminal during normal signal processing.

3. The semiconductor integrated circuit of claim 1, wherein said second power supply value is sufficient to carry out a voltage acceleration test on said signal processing circuit.

* * * * *